US010418229B2

(12) United States Patent
Sun et al.

(10) Patent No.: US 10,418,229 B2
(45) Date of Patent: Sep. 17, 2019

(54) AEROSOL DEPOSITION COATING FOR SEMICONDUCTOR CHAMBER COMPONENTS

(71) Applicant: Applied Materials, Inc., Santa Clara, CA (US)

(72) Inventors: Jennifer Y. Sun, Mountain View, CA (US); Biraja Kanungo, San Jose, CA (US); Tom Cho, Los Altos, CA (US); Ying Zhang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 106 days.

(21) Appl. No.: 15/620,700

(22) Filed: Jun. 12, 2017

(65) Prior Publication Data

US 2017/0287683 A1 Oct. 5, 2017

Related U.S. Application Data

(62) Division of application No. 14/282,824, filed on May 20, 2014, now Pat. No. 9,708,713.

(60) Provisional application No. 61/827,290, filed on May 24, 2013.

(51) Int. Cl.
*C23C 24/04* (2006.01)
*H01J 37/32* (2006.01)

(52) U.S. Cl.
CPC ........ *H01J 37/32807* (2013.01); *C23C 24/04* (2013.01); *H01J 37/3244* (2013.01); *Y10T 428/24413* (2015.01)

(58) Field of Classification Search
CPC . H01J 37/32807; H01J 37/3244; C23C 24/04; Y10T 428/24413
See application file for complete search history.

(56) References Cited

U.S. PATENT DOCUMENTS

| | | | |
|---|---|---|---|
| 6,383,964 B1 | 5/2002 | Nakahara et al. | |
| 6,641,941 B2 | 11/2003 | Yamada et al. | |
| 6,645,585 B2 | 11/2003 | Ozono | |
| 7,101,819 B2 | 9/2006 | Rosenflanz et al. | |
| 7,442,450 B2 | 10/2008 | Aihara et al. | |
| 7,479,464 B2 | 1/2009 | Sun et al. | |
| 7,510,585 B2 | 3/2009 | Rosenflanz | |
| 7,696,117 B2 | 4/2010 | Sun et al. | |
| 8,034,734 B2 | 10/2011 | Sun et al. | |
| 8,114,473 B2 | 2/2012 | Iwasawa et al. | |
| 8,206,829 B2 | 6/2012 | Sun et al. | |
| 8,226,740 B2 * | 7/2012 | Chaumonnot .......... | C01B 39/48 502/258 |
| 8,367,227 B2 | 2/2013 | Sun et al. | |
| 8,941,969 B2 | 1/2015 | Thach et al. | |
| 9,034,199 B2 | 5/2015 | Duan et al. | |
| 9,090,046 B2 | 7/2015 | Sun et al. | |
| 9,212,099 B2 | 12/2015 | Sun et al. | |
| 9,556,507 B2 | 1/2017 | Duan et al. | |
| 9,666,466 B2 | 5/2017 | Parkhe et al. | |
| 2002/0100424 A1 | 8/2002 | Sun et al. | |
| 2002/0192375 A1 | 12/2002 | Sun et al. | |
| 2003/0110708 A1 | 6/2003 | Rosenflanz | |
| 2004/0026030 A1 | 2/2004 | Hatono et al. | |
| 2004/0033385 A1 | 2/2004 | Kaushal et al. | |
| 2004/0043230 A1 | 3/2004 | Hatono et al. | |
| 2004/0126614 A1 | 7/2004 | Maeda et al. | |
| 2004/0227227 A1 | 11/2004 | Imanaka et al. | |
| 2005/0037193 A1 | 2/2005 | Sun et al. | |
| 2006/0141144 A1 | 6/2006 | Hatono et al. | |
| 2006/0159946 A1 | 7/2006 | Iwasawa et al. | |
| 2007/0079936 A1 | 4/2007 | Li et al. | |
| 2007/0274837 A1 | 11/2007 | Taylor et al. | |
| 2008/0003184 A1* | 1/2008 | Uvdal ................ | A61K 49/1833 424/9.323 |
| 2008/0029032 A1 | 2/2008 | Sun et al. | |
| 2008/0108225 A1 | 5/2008 | Sun et al. | |
| 2008/0213496 A1 | 9/2008 | Sun et al. | |
| 2008/0264564 A1 | 10/2008 | Sun et al. | |
| 2008/0264565 A1 | 10/2008 | Sun et al. | |
| 2009/0036292 A1 | 2/2009 | Sun et al. | |
| 2009/0214825 A1 | 8/2009 | Sun et al. | |
| 2010/0119843 A1 | 5/2010 | Sun et al. | |
| 2010/0129670 A1 | 5/2010 | Sun et al. | |
| 2010/0160143 A1 | 6/2010 | Sun et al. | |
| 2011/0198034 A1 | 8/2011 | Sun et al. | |
| 2012/0034469 A1 | 2/2012 | Sun et al. | |
| 2012/0104703 A1 | 5/2012 | Sun et al. | |
| 2012/0125488 A1 | 5/2012 | Sun et al. | |

(Continued)

FOREIGN PATENT DOCUMENTS

| | | |
|---|---|---|
| EP | 1158072 A | 11/2001 |
| EP | 1231294 A | 8/2002 |

(Continued)

OTHER PUBLICATIONS

Iwasawa, J. et al.; Dense yttrium oxide film prepared by aerosol deposition process at room temperature; Journal of the Ceramic Society of Japan, vol. 114, No. 3, Mar. 2006, pp. 272-276, Ceramic Soc. Japan, Japan.

Iwasawa, J., et al.; Plasma-resistant dense yttrium oxide film prepared by aerosol deposition process at room temperature; Journal of the Ceramic Society of Japan, vol. 90, No. 8, Aug. 2007, pp. 2327-2332, Ceramic Soc. Japan, Japan.

Lebedev, M., et al.; Substrate heating effects on hardness of an alpha-Al2O3 thick film formed by aerosol deposition method; Journal of Crystal Growth, vol. 275, No. 1-2, Feb. 15, 2005, pp. e1301-e1306, Elsevier, Amsterdam, NL.

Akedo, J., et al. "Aerosol Deposition Method (ADM) for Nano-Crystal Ceramics Coating Without Firing", Material Research Society Symp. Proc. vol. 778 (2003), 6 pages.

(Continued)

*Primary Examiner* — Patrick D Niland
(74) *Attorney, Agent, or Firm* — Lowenstein Sandler LLP

(57) ABSTRACT

An component of a processing chamber comprises an aerosol deposited coating on the component, the aerosol deposited coating comprising a first type of metal oxide nanoparticle and a second type of metal oxide nanoparticle.

20 Claims, 4 Drawing Sheets

(56) References Cited

U.S. PATENT DOCUMENTS

| | | |
|---|---|---|
| 2012/0183790 A1 | 7/2012 | Petorak et al. |
| 2013/0216783 A1 | 8/2013 | Duan et al. |
| 2013/0216821 A1 | 8/2013 | Sun et al. |
| 2013/0224498 A1 | 8/2013 | Sun et al. |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2014/0030486 A1 | 1/2014 | Sun et al. |
| 2014/0030533 A1 | 1/2014 | Sun et al. |
| 2014/0154465 A1 | 6/2014 | Sun et al. |
| 2014/0159325 A1 | 6/2014 | Parkhe et al. |
| 2014/0221188 A1 | 8/2014 | Banda et al. |
| 2014/0262037 A1 | 9/2014 | Duan et al. |
| 2014/0349073 A1 | 11/2014 | Sun et al. |
| 2014/0363596 A1 | 12/2014 | Sun et al. |
| 2014/0377504 A1 | 12/2014 | Sun et al. |
| 2015/0024155 A1 | 1/2015 | Sun et al. |
| 2015/0079370 A1 | 3/2015 | Sun et al. |
| 2015/0143677 A1 | 5/2015 | Sun et al. |
| 2015/0202834 A1* | 7/2015 | Free ............... B32B 37/025 428/141 |
| 2015/0218057 A1 | 8/2015 | Duan et al. |
| 2015/0299050 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |
| 2016/0326060 A1 | 11/2016 | Sun et al. |
| 2017/0130319 A1 | 5/2017 | Sun et al. |

FOREIGN PATENT DOCUMENTS

| | | |
|---|---|---|
| EP | 1777317 A1 | 4/2007 |
| EP | 1777731 A1 | 4/2007 |
| JP | 2000001362 | 1/2000 |
| JP | 2009-536732 A | 10/2009 |
| KR | 10-2011-0028378 | 3/2011 |
| WO | WO2013126466 A1 | 8/2013 |
| WO | WO2013155220 A1 | 10/2013 |
| WO | WO2013162909 A1 | 10/2013 |
| WO | WO2014018830 A1 | 1/2014 |
| WO | WO2014018835 A1 | 1/2014 |
| WO | WO20140190211 | 11/2014 |

OTHER PUBLICATIONS

Wang, X.W., et al. "RF Plasma Aerosol Deposition of Superconductive Y1B 2C3O1-, Films et Atmospheric Pressure", Applied Physics Letter, vol. 57, Issue 15, pp. 1581-1583 (Oct. 1990).

International Search Report of the International Searching Authority dated Sep. 17, 2014 in International Application No. PCT/US2014/039244.

* cited by examiner

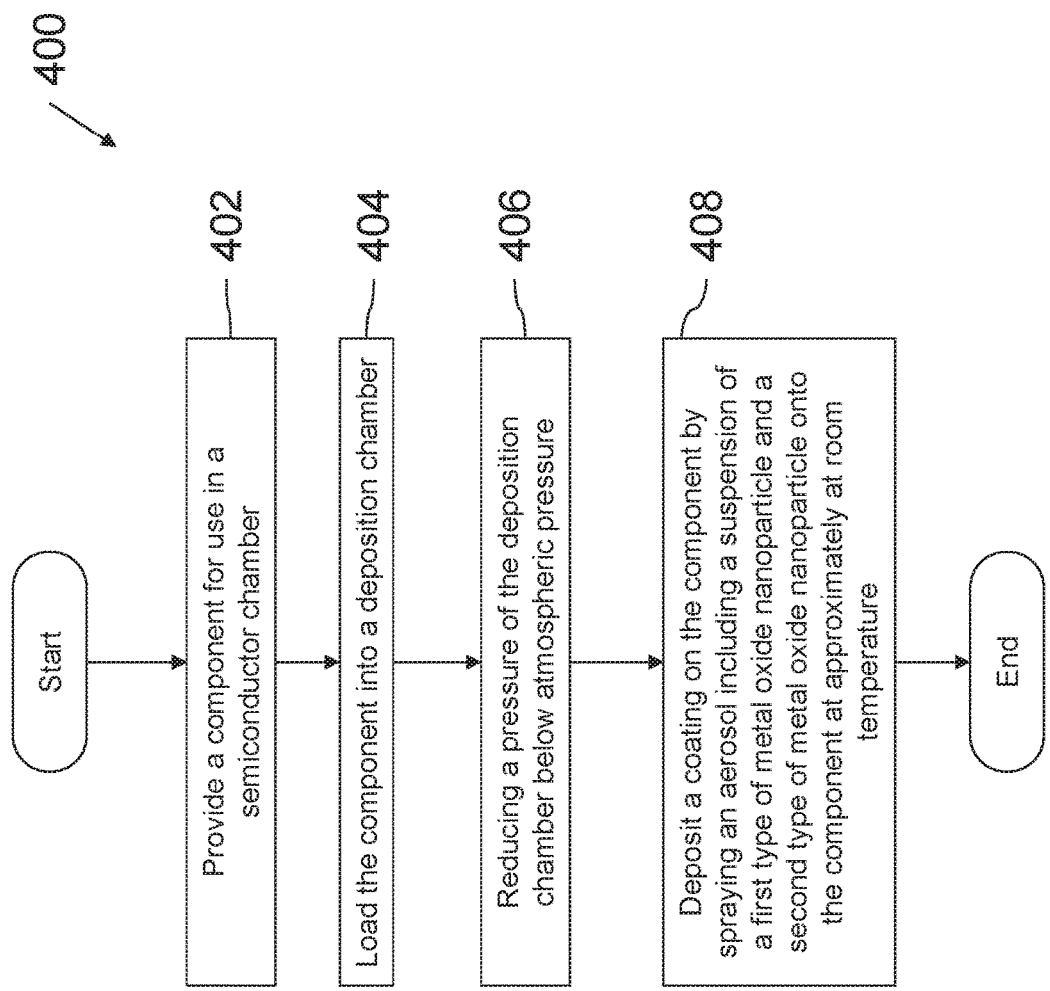

US 10,418,229 B2

AEROSOL DEPOSITION COATING FOR SEMICONDUCTOR CHAMBER COMPONENTS

RELATED APPLICATIONS

This application is a divisional application of U.S. patent application Ser. No. 14/282,824 filed on May 20, 2014, which claims the benefit of U.S. Provisional Application No. 61/827,290 filed on May 24, 2013. U.S. patent application Ser. No. 14/282,824 is incorporated by reference herein.

TECHNICAL FIELD

Embodiments of the present disclosure relate, in general, to aerosol deposition coatings on articles and to a process for applying an aerosol deposition coating to a substrate.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects (i.e., on-wafer defects, such as particles and metal contamination).

As device geometries shrink, susceptibility to defects increases and allowable levels of particle contamination may be reduced. To minimize particle contamination introduced by plasma etch and/or plasma clean processes, chamber materials have been developed that are resistant to plasmas. Different materials provide different material properties, such as plasma resistance, rigidity, flexural strength, thermal shock resistance, and so on. Also, different materials have different material costs. Accordingly, some materials have superior plasma resistance, other materials have lower costs, and still other materials have superior flexural strength and/or thermal shock resistance.

SUMMARY

In one embodiment, a component of a processing chamber comprises an aerosol deposited coating on the component, the aerosol deposited coating comprising a first type of metal oxide nanoparticle and a second type of metal oxide nanoparticle.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4 illustrates a method of coating via aerosol deposition, in accordance with one embodiment of the present invention.

DETAILED DESCRIPTION OF EMBODIMENTS

Figure 1:
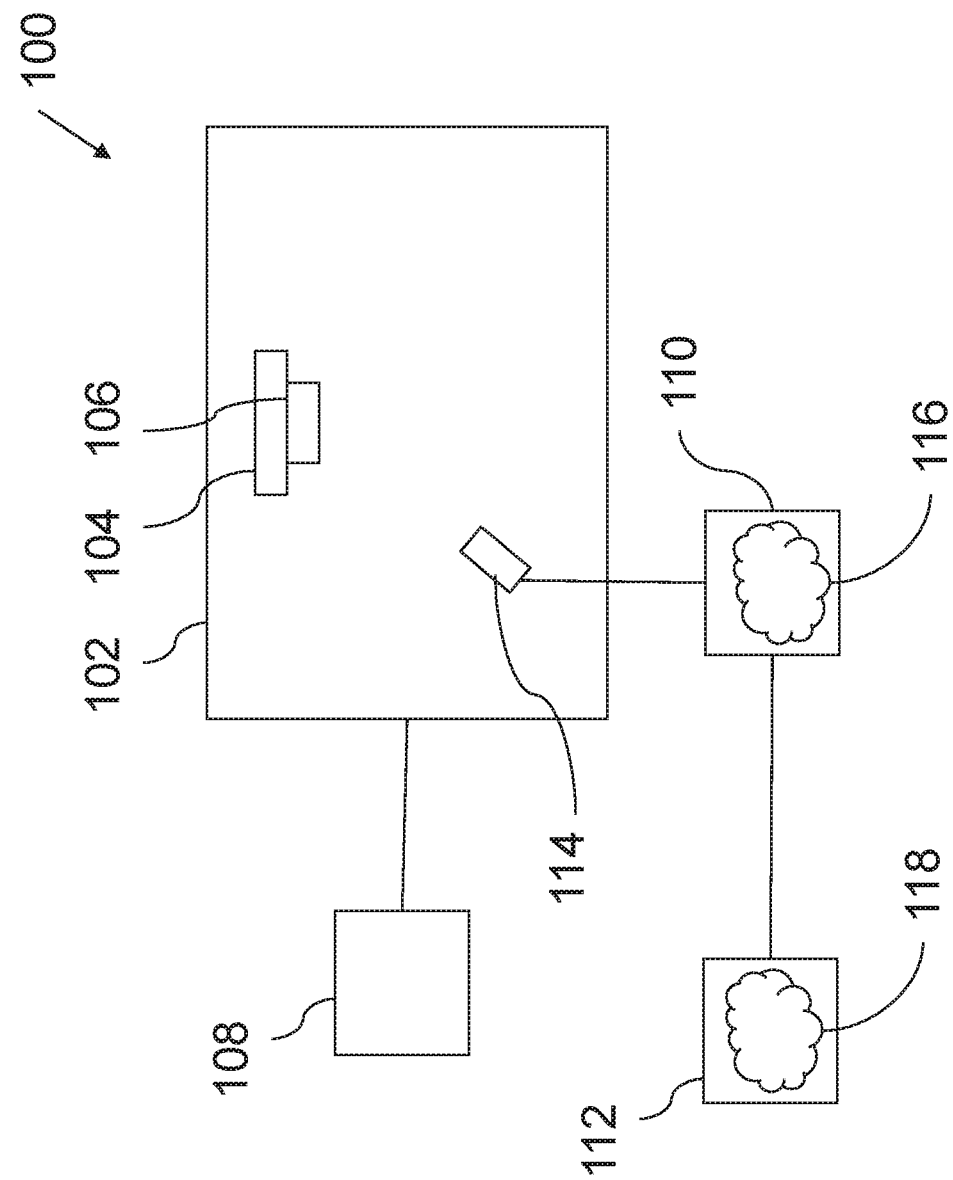
FIG. 1 illustrates an exemplary architecture of a manufacturing system, in accordance with one embodiment of the present invention.

Embodiments of the disclosure are directed to a process for applying a coating of multiple metal oxides to a substrate, such as a component for use in a semiconductor manufacturing chamber. A component for use in a semiconductor manufacturing chamber for plasma etching is located in a deposition chamber, where pressure in the deposition chamber is reduced from atmospheric pressure by a vacuum system. A coating is deposited on the component via a pressurized flow of a powder directed to the component in the deposition chamber at room temperature, where the powder includes at least two types of metal oxide nanoparticles. This coating can increase the lifetime of the component and decrease on-wafer defects during semiconductor manufacturing.

Aerosol deposition of a plasma resistant coating (i.e., a coating that is resistant to corrosive gas present during plasma etching of a wafer) can be applied over chamber components with two-dimensional geometries and three-dimensional geometries. For example, the chamber components can include lids, electrostatic chucks, process-kit rings, chamber liners, nozzles, and showerheads. The components can also include walls, bases, gas distribution plates, substrate holding frames, a cathode sleeve, and a cathode of a plasma etcher, a plasma cleaner, a plasma propulsion system, and so forth.

The types of metal oxides can include $Y_2O_3$, $Er_2O_3$, $Gd_2O_3$, or another rare earth metal oxide. For example, the coating materials can be rare earth oxides, including metal oxide mixtures that form solid solution such as $Y_2O_3$, $Al_2O_3$, $ZrO_2$, $Er_2O_3$, $Nd_2O_3$, $Gd_2O_3$, $Nb_2O_5$, $CeO_2$, $Sm_2O_3$, $Yb_2O_3$, and physical blends of different rare earth metal oxides such as $Y_2O_3$, $Al_2O_3$, $ZrO_2$, $Er_2O_3$, $Nd_2O_3$, $Gd_2O_3$, $Nb_2O_5$, $CeO_2$, $Sm_2O_3$, $Yb_2O_3$. An additional coating layer can be deposited on the component via a pressurized flow of an additional powder directed to the component in the deposition chamber at room temperature. The coating can have a low erosion rate when exposed to plasma.

Rather than coating by aerosol deposition a single metal oxide (e.g., $Y_2O_3$ or $Al_2O_3$) which can be damaged by aggressive chemistries (e.g., $CH_4$, $H_2$, CO, and other reducing chemistries), aerosol deposition of multi-oxide compositions (e.g., 2, 3, 4, 5, or more metal oxides) can provide a dense and conforming coating that is more resistant to these aggressive chemistries. Further, because aerosol deposition can be performed at lower temperatures than plasma coating, thermal mismatch concerns are minimized When the terms "about" and "approximately" are used herein, these are intended to mean that the nominal value presented is precise within ±10%. Note also that some embodiments are described herein with reference to components used in plasma etchers for semiconductor manufacturing. However, it should be understood that such plasma etchers may also be used to manufacture micro-electro-mechanical systems (MEMS)) devices.

FIG. 1 illustrates an exemplary architecture of a manufacturing system 100. The manufacturing system 100 can be for applying a coating of multiple metal oxides to a component for semiconductor manufacturing via aerosol deposition. The manufacturing system 100 includes a deposition chamber 102, which can include a stage 104 for mounting a substrate 106. Air pressure in the deposition chamber 102 can be reduced via a vacuum system 108. An aerosol chamber 110 containing a coating powder 116 is coupled to a gas container 112 containing a carrier gas 118 for propelling the coating powder 116 and a nozzle 114 for directing the coating powder 116 onto the substrate 106 to form a coating.

The substrate 106 can be a component used for semiconductor manufacturing. The component may be a component of an etch reactor, or a thermal reactor, of a semiconductor processing chamber, and so forth. Examples of components include a lid, an electrostatic chuck, process-kit rings, a chamber liner, a nozzle, a showerhead, a wall, a base, a gas distribution plate, showerhead base, a substrate holding frame, a cathode sleeve, and a cathode. The substrate 106 can be formed of a material such as aluminum, silicon, quartz, bulk Yttria, bulk alumina, a bulk ceramic compound of $Y_4Al_2O_9$ and a solid-solution of $Y_2O_3$—$ZrO_2$, plasma-sprayed yttria, plasma sprayed alumina, a plasma sprayed ceramic compound of $Y_4Al_2O_9$ and a solid-solution of $Y_2O_3$—$ZrO_2$, silicon carbide, or any other material used in a semiconductor manufacturing chamber component.

In one embodiment, the surface of the substrate 106 can be polished to reduce a surface roughness of the substrate. For example, the surface roughness can be less than about 0.2 microinch, which can improve coating thickness uniformity and coverage. Because the coatings according to one embodiment are typically thin (e.g., less than about 50 microns), high roughness could block some areas from being coated since aerosol deposition is a line of sight process.

The substrate 106 can be mounted on the stage 104 in the deposition chamber 102 during deposition of a coating. The stage 104 can be moveable stage (e.g., motorized stage) that can be moved in one, two, or three dimensions, and/or rotated/tilted about in one or more directions, such that the stage 104 can be moved to different positions to facilitate coating of the substrate 106 with coating powder 116 being propelled from the nozzle 114 in an aerosol. For example, since application of the coating via an aerosol spray is a line of sight process, the stage 104 can be moved to coat different portions or sides of the substrate 106. If the substrate 106 has different sides that need to be coated or a complicated geometry, the stage 104 can adjust the position of the substrate 106 with respect to the nozzle 114 so that the whole assembly can be coated. In other words, the nozzle 114 can be selectively aimed at certain portions of the substrate 106 from various angles and orientations.

In one embodiment, the deposition chamber 102 of the manufacturing system 100 can be evacuated using the vacuum system 108, such that a vacuum is present in the deposition chamber 102. For example, the vacuum can be less than about 0.1 mTorr. Providing a vacuum in the deposition chamber 102 can facilitate application of the coating. For example, the coating powder 116 being propelled from the nozzle encounters less resistance as the coating powder 116 travels to the substrate 106 when the deposition chamber 102 is under a vacuum. Therefore, the coating powder 116 can impact the substrate 106 at a higher rate of speed, which facilitates adherence to the substrate 106 and formation of the coating.

The gas container 112 holds pressurized carrier gas 118, such as Nitrogen or Argon. The pressurized carrier gas 118 travels under pressure from the gas container 112 to the aerosol chamber 110. As the pressurized carrier gas 118 travels from the aerosol chamber 110 to the nozzle 114, the carrier gas 118 propels some of the coating powder 116 towards the nozzle 114.

In one embodiment, the particles of the coating powder are nanosized, and the coating powder 116 has a certain fluidity. Further, rather than coating a single oxide such as Yttria (which may not be compatible for certain chemistries), the coating powder 116 can include mixtures of multiple oxides for forming a composite coating, according to one embodiment. For example, coating powder can be a composite ceramic material or a mixture of multiple metal oxides and/or carbides. Examples of materials for the coating powder include $Y_2O_3$, $Al_2O_3$, YAG ($Y_3Al_5O_{12}$), Erbium Aluminum Garnet (EAG) ($Er_3Al_5O_{12}$), Yttrium Aluminum Monoclinic (YAM) ($Y_4Al_2O_9$), $Gd_2O_3$, $Er_2O_3$, $ZrO_2$, Yttria-stabilized zirconia (YSZ) and GdAG ($Gd_3Al_5O_{12}$).

Physical blends of different materials in a coating powder can form metal oxide composites in situ as a result of conversion of kinetic energy to thermal energy when the coating is applied to the substrate. Examples of these physical blends (i.e., a coating powder including particles of different materials) include, but are not limited to, $Y_2O_3$ and $Al_2O_3$ (which forms YAG); $Y_2O_3$, $Al_2O_3$ and $ZrO_2$ (which forms the ceramic compound of $Y_4Al_2O_9$ and a solid-solution of $Y_2O_3$—$ZrO_2$); $Er_2O_3$ and $Al_2O_3$ (which forms EAG); $Er_2O_3$, $Y_2O_3$ and $Al_2O_3$; $Er_2O_3$, $Y_2O_3$, $Al_2O_3$ and $ZrO_2$; and $Gd_2O_3$ and $Al_2O_3$ (which forms GAG); $Gd_2O_3$, $Y_2O_3$ and $Al_2O_3$; $Gd_2O_3$, $Y_2O_3$, $Al_2O_3$ and $ZrO_2$. The coatings formed from these physical blends can have a low erosion rate and provide an improved on-wafer particle performance during use in a semiconductor manufacturing chamber.

With reference to the ceramic compound comprising $Y_4Al_2O_9$ and a solid-solution of $Y_2O_3$—$ZrO_2$, in one embodiment, the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

As the carrier gas 118 propelling a suspension of the coating powder 116 enters the deposition chamber 102 from an opening in the nozzle 114, the coating powder 116 is propelled towards the substrate 106. In one embodiment, the carrier gas 118 is pressurized such that the coating powder 116 is propelled towards the substrate 106 at a rate of around 150 m/s to about 500 m/s.

In one embodiment, the nozzle 114 is formed to be wear resistant. Due to the movement of the coating powder 116 through the nozzle 114 at a high velocity, the nozzle 114 can rapidly wear and degrade. However, the nozzle 114 can be formed in a shape and from a material such that wear is minimized or reduced.

Upon impacting the substrate 106, the particles of the coating powder 116 fracture and deform from the kinetic energy to produce an anchor layer that adheres to the substrate 106. As the application of the coating powder 116 continues, the particles become a coating or film by bonding to themselves. The coating on the substrate 106 continues to grow by continuous collision of the particles of the coating powder 116 on the substrate 106. In other words, the particles are mechanically colliding with each other and the substrate at a high speed under a vacuum to break into smaller pieces to form a dense layer, rather than melting. In one embodiment, the particle crystal structure of the particles of the coating powder 116 remains after application to the substrate 106. In one embodiment, melting can happen when kinetic energy converts to thermal energy, such that partial melting can occur when the particle break into smaller pieces and these particle become densely bonded.

Unlike application of a coating via plasma spray (which is a thermal technique performed at elevated temperatures), application of a coating via one embodiment can be performed at room-temperature or near room temperature. For example, application of the aerosol sprayed coating can be performed at around 15 degrees C. to about 30 C. In the case of an aerosol spray deposition, the substrate does not need to be heated and the application process does not significantly increase the temperature of the substrate being coated. Because the substrate remains at about room-temperature, applications according to one embodiment can be used to coat assemblies with multiple materials that can be damaged during thermal spray techniques due to thermal mismatch. For example, substrates that are formed of multiple parts that are affixed together (e.g., with an adhesive or a bonding layer that melts at a low temperature, such as about 100 degrees C. to about 130 degrees C.) may be damaged due to the thermal mismatch between the parts or melting of the adhesive if a higher temperature deposition process is used. Therefore, these types of substrates are less likely to be damaged by coating at room-temperature according to one embodiment.

In one embodiment, the coated substrate can be subjected to a post-coating process, such as a thermal treatment, which can further form a coating interface between the coating and the substrate. For example, a $Y_2O_3$ coating over $Al_2O_3$ substrate can form a YAG barrier layer post-thermal treatment that helps adhesion and provides a barrier layer to further protect the substrate. A coating of the ceramic compound of $Y_4Al_2O_9$ and a solid-solution of $Y_2O_3$—$ZrO_2$ over $Al_2O_3$ substrate can form a thin YAG barrier layer post thermal treatment. Similarly, an $Er_2O_3$ coating over $Al_2O_3$ substrate can form an EAG barrier layer, and so on (e.g., $Gd_2O_3$ over $Al_2O_3$ forms GAG). In one embodiment, the coated substrate can be heated to 1450 degrees C. for more than about 30 minutes.

Also, thermal treatment post coating can help facilitate compound formation from physical blends of different metal oxide mixtures. For example, a physical blend of $Y_2O_3$ and $Al_2O_3$ powder deposited via aerosol deposition coating followed by thermal treatment can form a uniform coating of YAG.

In one embodiment, the formation of a barrier layer between a coating and a substrate prohibits the reaction of process chemistry that penetrates the coating with an underlying substrate. This may minimize the occurrence of delamination. The barrier layer may increase adhesion strength of the ceramic coating, and may minimize peeling.

The barrier layer grows at a rate that is dependent upon temperature and time. As temperature and heat treatment duration increase, the thickness of the barrier layer also increases. Accordingly, the temperature (or temperatures) and the duration used to heat treat the ceramic article should be chosen to form a barrier layer that is not thicker than around 5 microns. In one embodiment, the temperature and duration are selected to cause a barrier layer of about 0.1 microns to about 5 microns to be formed. In one embodiment, the barrier layer has a minimum thickness that is sufficient to prevent gas from reacting with the ceramic substrate during processing (e.g., around 0.1 microns). In one embodiment, the barrier layer has a target thickness of 1-2 microns.

Figure 2:
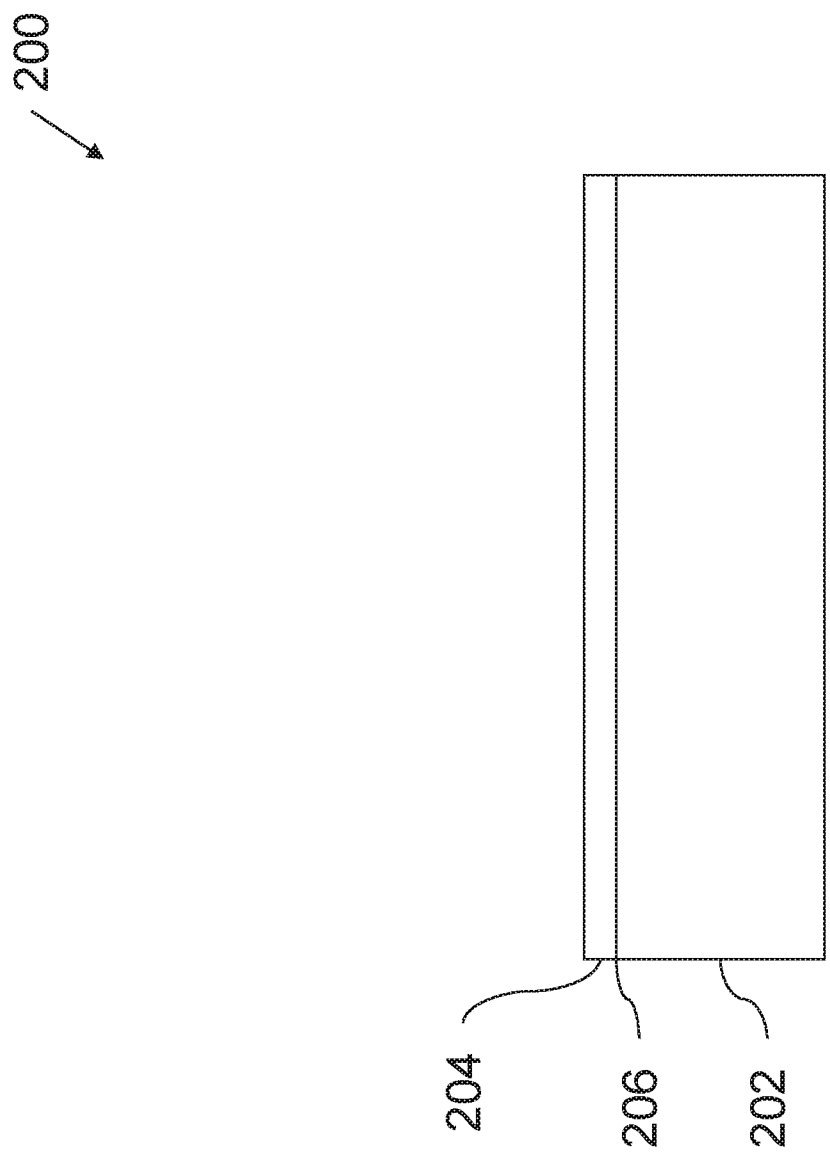
FIG. 2 illustrates a coating on a substrate, in accordance with one embodiment of the present invention.

FIG. 2 illustrates a component 200 including a coating 204 on a substrate 202 according to one embodiment. The substrate 202 can be substrate 106 from FIG. 1. The substrate 202 can be formed of a material such as ceramic, aluminum, quartz, alumina, silicon, bulk Yttria, plasma-sprayed Yttria, silicon carbide, metal, etc. The coating 204 can be formed using an aerosol deposition process as described with reference to FIG. 1.

In one embodiment, the surface of the substrate 202 to be coated can be polished to be smoother, for example, to facilitate adherence of the coating. For example, the surface roughness can be less than about 0.2 microinch.

In one embodiment, the coating can be from about 10 microns to about 50 microns thick.

In one embodiment where the component 200 is thermally treated, a barrier layer 206 can be formed between the substrate 202 and the coating 204. The barrier layer 206 can improve adhesion of the coating 204 to the substrate 202 and/or improve on-wafer particle performance of the component 200 during use in a semiconductor manufacturing chamber. The barrier layer may be YAG when the coating layer is composed of $Y_2O_3$ over $Al_2O_3$ substrate.

Figure 3:
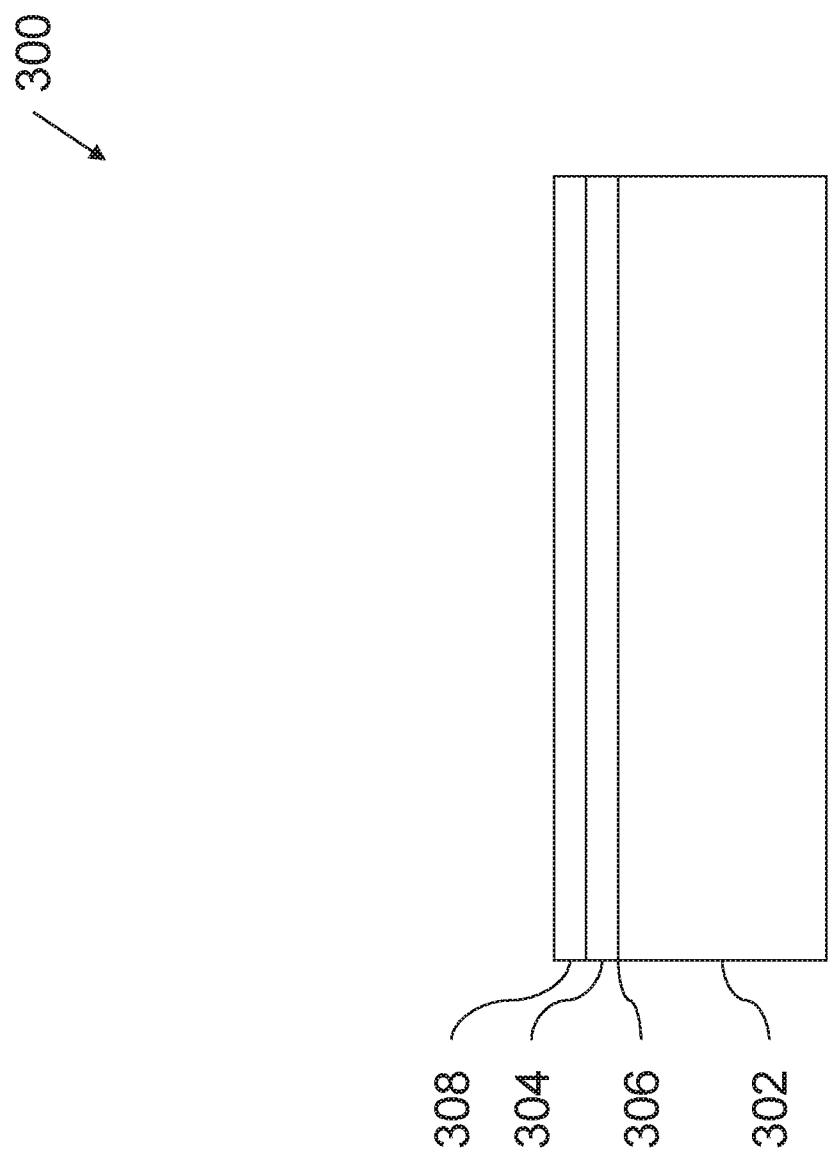
FIG. 3 illustrates a two-layered coating on a substrate, in accordance with one embodiment of the present invention.

FIG. 3 illustrates a component 300 including a two-layered coating on a substrate 302 according to one embodiment. Component 300 includes a substrate 302 with a first coating 304 and a second coating 308. The substrate 302 can be substrate 106 from FIG. 1. The first and second coatings 304 and 306 can be formed as described above (e.g., via aerosol deposition). For example, first coating 304 can be formed on the substrate 302 in a first aerosol deposition process. Subsequently, second coating 308 can be formed on the substrate 302 in a second aerosol deposition process. In one embodiment, the application of two different coatings allows the thermal gradient to be managed such that the part can be used at higher temperatures. For example, a multi-layer of YAG and the ceramic compound of $Y_4Al_2O_9$ and a solid-solution of $Y_2O_3$—$ZrO_2$ can be coated.

In one embodiment, the component 300 can be thermally treated after the application of first coating 304. The thermal treatment can occur either prior to or subsequent to the application of second coating 308. The thermal treatment can cause a barrier layer 306 to be formed between the substrate 302 and the coating 304.

FIG. 4 is a flow chart showing a method 400 for manufacturing a coated component, in accordance with embodiments of the present disclosure. Method 400 may be performed using the manufacturing system 100 of FIG. 1.

At block 402, a component for use in a semiconductor manufacturing environment is provided. For example, the component can be a substrate, as described above, such as a lid, an electrostatic chuck, a process-kit rings, a chamber liner, a nozzle, a showerhead, a wall, a base, a gas distribution plate, a substrate holding frame, a cathode sleeve, or a cathode. Further, the component can be formed of a material such as ceramic, aluminum, quartz, alumina, silicon, bulk Yttria, plasma-sprayed yttria, silicon carbide, metal, or any other substrate suitable for use for a component used in a semiconductor manufacturing chamber.

At block 404, the component is loaded into a deposition chamber. The deposition chamber can be deposition chamber 102 described above.

At block 406, a vacuum system reduces a pressure of the low-pressure deposition chamber to below atmospheric pressure. For example, the pressure may be reduced to a range from around 1 kPa to around about 50 kPa.

At block 408, a coating is deposited on the component by spraying an aerosol including a suspension of a first type of metal oxide nanoparticle and a second type of metal oxide nanoparticle onto the component at approximately room temperature. For example, the powder can include at least two of the following materials: $Y_2O_3$, $Al_2O_3$, YAG, EAG, $Gd_2$, $Er_2O_3$, $ZrO_2$, and GAG. These materials can be nanoparticles, and the materials can be blended in any suitable ratio. The two metal oxide nanoparticles may be suspended in a gas such as Nitrogen or Argon.

In one embodiment, the method further includes thermally treating the coated component to form a barrier layer between the component and the coating. For example, the coated component can be heated to 1450 degrees C. for more than 30 minutes. The barrier layer may have a thickness of from about 0.1 microns to about 5 microns, and can be YAG, EAG, GAG or other compounds such as YAM ($Y_4Al_2O_9$), YAP ($YAlO_3$) and similar compounds of Er and Gd.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An article comprising:
   a body, wherein the body has a surface roughness of less than about 0.2 microinch; and
   a coating on the body, the coating comprising a first particle of a first rare earth metal oxide, a second particle of a second rare earth metal oxide, and a third particle of a third metal oxide, wherein the coating has a particle crystal structure and wherein:
   the first rare earth metal oxide is $Y_2O_3$ and the coating comprises the $Y_2O_3$ in a range of 40 mol % to less than 100 mol %;
   the second rare earth metal oxide is $ZrO_2$ and the coating comprises the $ZrO_2$ in a range of greater than 0 mol % to less than 60 mol %; and
   the third metal oxide is $Al_2O_3$ and the coating comprises the $Al_2O_3$ at a range of greater than 0 mol % to 40 mol %.

2. The article of claim 1, wherein the body comprises Aluminum, quartz, bulk alumina, silicon, bulk Yttria, a bulk ceramic compound of $Y_4Al_2O_9$ and a solid-solution of $Y_2O_3$—$ZrO_2$, plasma sprayed Yttria, or silicon carbide.

3. A component of a processing chamber, the component comprising a coating that was deposited on the component by a process comprising:
   loading the component into a deposition chamber, the component having a surface roughness of less than about 0.2 microinch;
   reducing a pressure of the deposition chamber below atmospheric pressure; and
   depositing the coating on the component by spraying an aerosol of ceramic particles comprising a mixture of a first rare earth metal oxide, a second rare earth metal oxide, and a third metal oxide onto the component at approximately room temperature, wherein the coating has a particle crystal structure and wherein:
   the first rare earth metal oxide is $Y_2O_3$ and the mixture comprises the $Y_2O_3$ in a range of 40 mol % to less than 100 mol %;
   the second rare earth metal oxide is $ZrO_2$ and the mixture comprises the $ZrO_2$ in a range of greater than 0 mol % to less than 60 mol %; and
   the third metal oxide is $Al_2O_3$ and the mixture comprises the $Al_2O_3$ at a range of greater than 0 mol % to 40 mol %.

4. The component of claim 3, wherein the component further comprises a barrier layer that was formed by a process comprising:
   heating the component to a temperature in a range from about 1200 degrees C. to about 1600 degrees C. for a time in a range from about 30 minutes to about 6 hours after deposition of the coating, wherein the heating causes the barrier layer to form between the component and the coating.

5. The component of claim 3, wherein:
   the mixture comprises the $Y_2O_3$ in a range of 50-75 mol %;
   the mixture comprises the $ZrO_2$ in a range of 10-30 mol %; and
   the mixture comprises the $Al_2O_3$ in a range of 10-30 mol %.

6. The component of claim 3, wherein:
   the mixture comprises the $Y_2O_3$ in a range of 40 mol % to less than 100 mol %;

the mixture comprises the $ZrO_2$ in a range of greater than 0 mol % to less than 60 mol %; and the mixture comprises the $Al_2O_3$ in a range of greater than 0 mol % to less than 10 mol %.

7. The component of claim 3, wherein:

the mixture comprises the $Y_2O_3$ in a range of 40-60 mol %;

the mixture comprises the $ZrO_2$ in a range of greater than 30 mol % to 50 mol %; and the mixture comprises the $Al_2O_3$ in a range of 10-20 mol %.

8. The article of claim 1, wherein:

the coating comprises the $Y_2O_3$ in a range of 50-75 mol %;

the coating comprises the $ZrO_2$ in a range of 10-30 mol %; and the coating comprises the $Al_2O_3$ in a range of 10-30 mol %.

9. The article of claim 1, wherein:

the coating comprises the $Y_2O_3$ in a range of 40 mol % to less than 100 mol %;

the coating comprises the $ZrO_2$ in a range of greater than 0 mol % to less than 60 mol %; and the coating comprises the $Al_2O_3$ in a range of greater than 0 mol % to less than 10 mol %.

10. The article of claim 1, wherein:

the coating comprises the $Y_2O_3$ in a range of 40-60 mol %;

the coating comprises the $ZrO_2$ in a range of greater than 30 mol % to 50 mol %; and the coating comprises the $Al_2O_3$ in a range of 10-20 mol %.

11. The article of claim 1, wherein:

the coating comprises the $Y_2O_3$ in a range of 40 mol % to less than 50 mol %;

the coating comprises the $ZrO_2$ in a range of 20-40 mol %; and the coating comprises the $Al_2O_3$ in a range of 20-40 mol %.

12. The article of claim 1, wherein:

the coating comprises the $Y_2O_3$ in a range of greater than 70 mol % to 90 mol %;

the coating comprises the $ZrO_2$ in a range of greater than 0 mol % to 20 mol %; and the coating comprises the $Al_2O_3$ in a range of 10-20 mol %.

13. The article of claim 1, wherein:

the coating comprises the $Y_2O_3$ in a range of 60-80 mol %;

the coating comprises the $ZrO_2$ in a range of greater than 0 mol % to 10 mol %; and the coating comprises the $Al_2O_3$ in a range of 20-40 mol %.

14. The article of claim 1, wherein:

the coating comprises the $Y_2O_3$ in a range of 40-60 mol %;

the coating comprises the $ZrO_2$ in a range of greater than 0 mol % to 20 mol %; and the coating comprises the $Al_2O_3$ in a range of greater than 30 mol % to 40 mol %.

15. The article of claim 1, further comprising:

an additional coating on the body.

16. The article of claim 1, wherein the coating is an aerosol deposited coating, wherein the first particle is a first nanoparticle, the second particle is a second nanoparticle, and the third particle is a third nanoparticle.

17. An article comprising:

a component of a processing chamber; and a coating on the component, the coating comprising a first rare earth metal oxide and a second metal oxide, wherein the coating has a particle crystal structure and wherein:

the first rare earth metal oxide is $Er_2O_3$; and the second metal oxide is $Al_2O_3$.

18. The article of claim 17, wherein the component has a surface roughness of less than about 0.2 microinch.

19. The article of claim 17, wherein the coating is an aerosol deposited coating, and wherein the coating comprises nanoparticles the first rare earth metal oxide and nanoparticles of the second metal oxide.

20. The component of claim 3, wherein the ceramic particles comprise ceramic nanoparticles.

* * * * *